PULSE CONTROL APPARATUS

Filed July 10, 1959

WITNESSES

John E. Healy, Jr.

James F. Young

INVENTOR

James Dobbie

BY M. J. Brodahl

ATTORNEY

United States Patent Office 2,977,486

Patented Mar. 28, 1961

2,977,486

PULSE CONTROL APPARATUS

James Dobbie, Williamsville, N.Y., assignor to Westinghouse Electric Corporation, East Pittsburgh, Pa., a corporation of Pennsylvania Filed July 10, 1959, Ser. No. 826,174

8 Claims. (Cl. 307—88.5)

The present invention relates to pulse control apparatus in general, and, in particular relates to pulse delay circuits utilizing transistorized logic elements.

In digital computer applications it is often necessary to have a circuit which will delay pulse signals for various reasons, such as for use with coincident pulse control apparatus operative with two separate input lines and operative to pass through a control circuit non-coincidence pulses on two respective output lines. Such a circuit is useful for example as a pulse control circuit operative with a differential pulse rate circuit. A differential pulse rate circuit gives an output which is equal to the difference in pulse rates between two lines of applied input pulses. When the input pulse rate on one line is the higher the output should indicate this difference of pulse rates. However, most of the differential pulse rate circuits should not have coincident pulses occurring at their inputs or they will malfunction. Pulse delay control apparatus such as in accordance with the teachings of the present invention can be very useful in this regard.

Accordingly, it is an object of the present invention to provide an improved pulse delay control circuit.

It is another object of the present invention to provide an improved pulse delay control circuit or apparatus which provides an output pulse that is delayed by a time interval having a predetermined relationship such as being equal to the duration of an applied input pulse.

It is still another object of the present invention to provide an improved pulse delay circuit providing an output pulse delayed by a predetermined and desired time interval, such as a time interval substantially equal to the duration of an input pulse, said time interval being variable as may be desired and said duration being independent of gain changes in the logic elements or circuits utilized in the pulse control apparatus.

Further objects of the present invention will become apparent from the following description taken in conjunction with the accompanying drawings, wherein.

Figure 1:
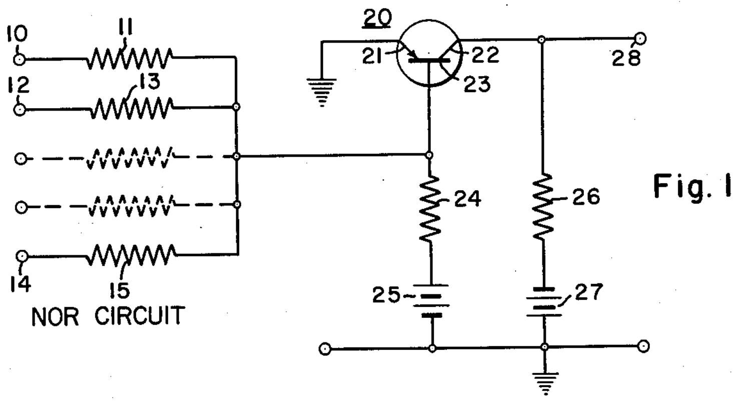
Figure 1 is a schematic showing of a logic circuit which may be utilized in the pulse control apparatus of the present invention.

Referring to Fig. 1, there is shown a logic circuit operative to perform a logical function commonly known to those skilled in the present art as the NOR logic function. A NOR logic function is performed by a circuit apparatus which has a first output voltage level only if neither of its inputs namely an input A nor an input B nor any other input is energized by an input signal. If the logic function is performed in a binary system, then the NOR logic circuit has an output of a one value signal only if neither an input A nor an input B nor any other input is energized by a one value input signal. If any of the plurality of inputs to the NOR logic circuit is energized by a one value input signal then the output signal of the NOR logic circuit has a zero value.

The transistor 20 shown in Fig. 1 includes a semiconductive body having an emitter electrode 21, a collector electrode 22 and a base electrode 23. The emitter electrode 21 is connected to ground, and the base electrode 23 is connected to a plurality of input terminals 10, 12 and 14 through their respective isolating impedance members 11, 13 and 15. The base electrode 23 is also connected through a resistor 24 to a B+ bias source 25. The collector electrode 22 is connected through a current limiting resistor 26 to a B— voltage source 27. The collector electrode 22 is also connected to an output terminal 28.

In operation, the B+ bias source 25 biases the transistor 20 to a cutoff condition of operation through the resistor 24. Thusly, when there are no one value negative input signals applied at any of the input terminals 10, 12 and 14 the transistor 20 is held in its cutoff operating condition and a one value output signal will appear at the terminal 28 which will be approximately the value of the B— source 27, which value is arbitrarily defined as a one value output signal. If a one value negative input pulse sufficient in magnitude to drive the transistor 20 to a fully saturated and conducting condition is applied to any one of the input terminals 10, 12 and 14, the transistor 20 will conduct and there will be no one value output signal or in other words, there will be a zero output signal at the terminal 28. Therefore, it may be seen that the apparatus illustrated in Fig. 1 performs the NOR logic function as hereinbefore described. When a negative one value input pulse is present at any one of the input terminals 10, 12 and 14, the output signal at the output terminal 28 will be of a zero value. If no such one value input signal is present at any one of the input terminals 10, 12 and 14, the output signal at the output terminal 28 will be of a one value.

Although the apparatus as shown in Fig. 1 is illustrated as using a p-n-p type of transistor, an n-p-n type of transistor may be utilized when the polarities of the bias voltage source 25, supply voltage source 27 and the applied input pulses or signals are reversed. For a further description of the operation and characteristics of a NOR logic circuit such as the one shown in Fig. 1, reference is made to a copending patent application, Serial No. 628,332 entitled "NOR Elements for Control Systems," filed December 14, 1956 and assigned to the same assignee as the present invention.

Figure 2:
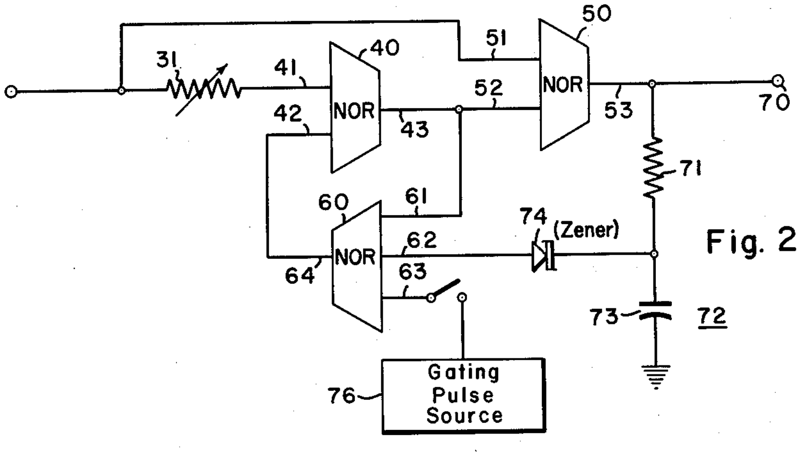
Fig. 2 is a diagrammatic showing of pulse control apparatus in accordance with the teachings of the present invention.

Referring to Fig. 2, there is a showing of pulse control apparatus embodying the teachings of the present invention and utilizing NOR logic circuits as schematically shown in Fig. 1.

A first NOR logic circuit 40 has two inputs 41 and 42 and an output 43. A second NOR logic circuit 50 has a pair of inputs 51 and 52 and an output 53. A feedback NOR logic circuit 60 has three inputs 61, 62 and 63 and an output 64. An input terminal 30 for the pulse delay apparatus is connected through a resistor 31 to an input 41 of the NOR circuit 40. The input terminal 30 is also connected to an input 51 of the second NOR circuit 50. The output 43 of the NOR circuit 40 is connected to the other input 52 of the NOR circuit 50. Also, the output 43 of the NOR logic circuit 40 is connected to an input 61 of the feedback NOR logic circuit 60. The output 53 of the NOR logic circuit 50 is connected to an output terminal 70, which is the output terminal of the pulse delay circuit or control apparatus shown in Fig. 2. The output 53 of the NOR circuit 50 is also connected through a resistor and capacitor signal time delay circuit 72, and a Zener type semiconductor diode 74 in the reverse direction, to another input 62 of the feedback NOR circuit 60. The output 64 of the NOR circuit 60 is connected to the other input 42 of the first NOR circuit 40.

In operation, when a negative or one value input pulse appears at the input terminal 30, the NOR circuit 50 which has already had a zero value output signal is further blocked into the zero value signal operating condition by the receipt of the one value input pulse at one of its inputs 51. The one value input pulse applied to the terminal 30 also is applied to the input 41 of the NOR circuit 40 to change the output signal of the NOR circuit 40 from a one value output signal to a zero value output signal. The resistor 31 delays the application of the input signal from the terminal 30 to the NOR circuit 40 until after this same input signal has blocked the NOR circuit 50 at the input 51 of the NOR circuit 50. Thusly, when the output 43 of the NOR circuit 40 changes from a one value signal to a zero value signal the output signal of the NOR circuit 50 at its output 53 remains at a zero value.

When the output signal from the output 43 of the NOR circuit 40 changes from a one value to a zero value, the input 61 of the NOR circuit 60 is no longer energized and this allows the NOR circuit 60 to provide a one value output signal at its output 64 which is applied to the input 42 of the first NOR circuit 40 and this further blocks the NOR circuit 40.

When the negative one value input pulse at the terminal 30 drops to a zero value, the output 43 of the NOR element 40 remains at a zero value signal because of the one value signal applied to the input 42 from the feedback NOR circuit 60. However, the one value input pulse is now removed from the input terminal 30, so the NOR circuit 50 has its output signal changed from a zero value signal to a one value signal because at the present time, neither of the inputs 51 and 52 are energized by a one value signal. The resistor capacitor circuit 72, which can include a series resistor 71 and a parallel capacitor 73 as shown in Fig. 2, now stores energy from the output signal of the NOR circuit 50 in the capacitor 73 until the breakdown voltage of the Zener type semiconductor diode 74 is reached and the diode 74 then switches or breaks down in the reverse direction. The switching or breaking down of the latter diode 74 allows a one value input signal to be applied to the input 62 of the NOR circuit 60 to change the output state of the NOR circuit 60 from a one value signal to a zero value signal. The removal of the one value signal from the input 42 of the NOR circuit 40 allows the latter NOR circuit 40 to resume its original steady state operating condition to again have a one value output signal at its output 43, which now blocks the NOR circuit 50. This places the pulse control apparatus shown in Fig. 2 in its original steady state condition and it is ready to receive another one value input pulse or signal at the terminal 30.

The discharge of the capacitor 73 through the Zener diode 74 in a reverse direction will eventually decay to a point below which this breakdown condition of the Zener type diode 74 cannot be sustained. However, this does not happen until the NOR circuit 40 has reached its steady state operating condition to provide a one value output signal, which energizes an input 61 of the NOR circuit 60 to hold the NOR circuit 60 in its steady state blocked or zero value output signal condition.

Another operating feature of the pulse delayed apparatus illustrated in Fig. 2 is that the output pulse from the pulse delay or control apparatus and received from the output terminal 70 can be blocked by a gating or control pulse applied from a suitable gating pulse source 76 to the input 63 of the NOR circuit 60. The gating pulse applied to the input 63 maintains a zero value output signal from the NOR circuit 60 at the output 64. This is operative to block a one value output pulse at the terminal 70 because if an input pulse is applied at the terminal 30, the operation proceeds as hereinbefore described until the input pulse applied to the terminal 30 drops to a zero value. Under normal operation, the NOR circuit 40 would have remained at a zero value output state of operation because of the one value signal applied at its input 42 from the NOR circuit 60. Therefore, the NOR circuit 50 would have changed its output state from a zero value output signal to a one value output signal. However, since the output signal from the NOR circuit 60 is maintained at a zero value due to the gating or control pulse supplied from the pulse source 76 an output pulse never appears at the output terminal 70. There is now provided a one value output signal from the NOR circuit 40 which blocks the NOR circuit 50 such that the NOR circuit 50 does not provide this one value output signal.

Figure 3:
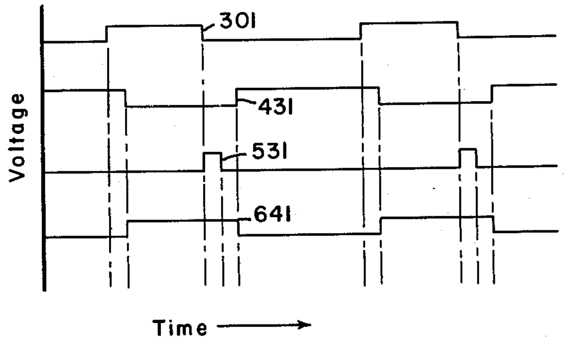
Fig. 3 is a graphical illustration of wave forms present at selected points of the pulse control apparatus as shown in Fig. 2.

Referring to Fig. 3, there is a graphical illustration of the wave forms present in the control apparatus shown in Fig. 2. The curve 301 illustrates the input pulse signal that may be applied to the terminal 30. The curve 531 illustrates the output signal from the NOR circuit 50 which appears at the output terminal 70. The curve 431 illustrates the output signal from the NOR circuit 40. The curve 641 illustrates the output signal from the NOR circuit 60. It may be seen that the output signal as shown by the curve 531 is delayed by a time interval substantially equal to the duration of the applied input pulse as shown by the curve 301. The duration of the output pulse shown by the curve 531 may be varied by adjusting the value of the capacitor 73 or the resistor 71 as may be desired.

It should be here noted that the present patent application is related to a copending patent application filed July 1, 1959, Serial No. 824,392 by J. Dobbie entitled "Pulse Control Apparatus" and assigned to the same assignee as is the present application.

Although the present invention has been described with a certain degree of particularity, it should be understood that the present disclosure has been made only by way of example and that numerous changes in the details of construction and the combination and arrangement of parts may be resorted to without departing from the scope and spirit of the present invention.

I claim as my invention:

1. In pulse control apparatus operative to control an input pulse received by said control apparatus, the combination of a first control signal device having at least two inputs and being operative to provide a first control signal when neither of said inputs is energized, with one of said inputs being connected to be responsive to said input pulse, a second control signal device having a first input connected to be responsive to said input pulse and a second input connected to be responsive to said first control signal and being operative to provide a second control signal as an output signal for said control apparatus when neither of its first and second inputs are energized by respectively one of said input pulse and said first control signal, a third control signal device having a first input connected to be responsive to said first control signal and a second input connected to be responsive to said second control signal and being operative to provide a third control signal when neither of its first and second inputs are energized by respectively one of said first and second control signals, with the other of said two inputs of the first control signal device being connected to be responsive to said third control signal such that said first control signal is not provided when said other input is energized by said third control signal.

2. In pulse control apparatus operative to control an input pulse received by said control apparatus, the combination of a first control NOR device having at least two inputs and being operative to provide a first control signal when neither of said inputs is energized, with one of said inputs being connected to be responsive to said input pulse, a second control NOR device having a first input connected to be responsive to said input pulse and a second input connected to be responsive to said first control signal and being operative to provide a second control signal as an output signal for said control apparatus when neither of its first and second inputs are energized by one of said input pulse and said first control signal, a third control NOR device having a first input connected to be responsive to said first control signal and a second input connected to be responsive to said second control signal and being operative to provide a third control signal when neither of its first and second inputs are energized by one of said first and second control signals, with the other of said two inputs of the first control NOR device being connected to be responsive to said third control signal such that said first control signal is not provided when said other input is energized by said third control signal.

3. In pulse control apparatus operative with an input pulse, a first control signal device responsive to said input pulse for providing a first control signal when at least said input pulse is not present, a second control signal device responsive to each of said input pulse and said first control signal for providing a second control signal when neither of said input pulse and said first control signal are present, a third control signal device for providing a third control signal and being operatively connected to control the operation of said first control signal device such that said first control signal is not provided when said third control signal is present, with said third control signal device being responsive to each of said first control signal and said second control signal and being operative to provide said third control signal when neither of said first control signal and said second control signal are present.

4. In pulse control apparatus operative with an input pulse, a first control NOR device responsive to said input pulse for providing a first control signal when at least said input pulse is not present, a second control NOR device responsive to each of said input pulse and said first control signal for providing a second control signal when neither of said input pulse and said first control signal are present, a third control NOR device for providing a third control signal and being operatively connected to control the operation of said first control NOR device such that said first control signal is not provided when said third control signal is present, with said third control NOR device being responsive to each of said first control signal and said second control signal and being operative to provide said third control signal when neither of said first control signal and said second control signal are present.

5. In pulse control apparatus operative to control an input pulse received by said control apparatus, the combination of a signal delay device, a first control signal device responsive to said input pulse through said signal delay device for providing a first control signal when at least said input pulse is not present, a second control signal device connected to be responsive to said input pulse and said first control signal for providing a second control signal as an output signal for said pulse control apparatus when neither of said input pulse and said first control signal are present, a third control signal device responsive to each of said first control signal and said second control signal and being operative to provide a third control signal when neither of said first control signal and said second control signal are present, with said first control device being connected to be responsive to said third control signal such that said first control signal is not provided when said third control signal is present.

6. In pulse control apparatus operative to control an input pulse received by said control apparatus, the combination of a signal delay device, a first control NOR device responsive to said input pulse through said signal delay device for providing a first control signal when at least said input pulse is not present, a second control NOR device connected to be responsive to said input pulse and said first control signal for providing a second control signal as an output signal for said pulse control apparatus when neither of said input pulse and said first control signal are present, a third control NOR device responsive to each of said first control signal and said second control signal and being operative to provide a third control signal when neither of said first control signal and said second control signal are present, with said first control NOR device being connected to be responsive to said third control signal such that said first control signal is not provided when said third control signal is present.

7. In pulse control apparatus operative with an input pulse, the combination of a first control signal device responsive to said input pulse for providing a first control signal when at least said input pulse is not present, a second control signal device responsive to each of said input pulse and said first control signal for providing a second control signal when neither of said input pulse and said first control signal are present, a signal delay device, a third control signal device responsive to said first control signal and responsive to said second control signal through said signal delay device for providing a third control signal when said first control signal is not present and when said second control signal as delayed by said signal delay device is not present, a voltage breakdown device operatively connected to said third control signal device for controlling the provision of said third control signal in accordance with a predetermined operation of said signal delay device, with said first control signal device being responsive to said third control signal such that said first control signal is not provided when said third control signal is present.

8. In pulse control apparatus operative with an input pulse, the combination of a first control NOR device responsive to said input pulse for providing a first control signal when at least said input pulse is not present, a second control NOR device responsive to each of said input pulse and said first control signal for providing a second control signal when neither of said input pulse and said first control signal are present, a signal delay device, a third control NOR device responsive to said first control signal and responsive to said second control signal through said signal delay device for providing a third control signal when said first control signal is not present and when said second control signal as delayed by said signal delay device is not present, a voltage breakdown device operatively connected to said third control NOR device for controlling the provision of said third control signal in accordance with the operation of said signal delay device, with said first control NOR device being responsive to said third control signal such that said first control signal is not provided when said third control signal is present.

No references cited.